May 20, 1969 A. ROTH 3,445,685

FILTERING APPARATUS

Filed Nov. 10, 1966

INVENTOR.
ALBERT ROTH
BY Raymond L. Owens
ATTY

United States Patent Office 3,445,685

Patented May 20, 1969

3,445,685

FILTERING APPARATUS

Albert Roth, San Diego, Calif., assignor to General Dynamics Corporation, a corporation of Delaware Filed Nov. 10, 1966, Ser. No. 593,389
Int. Cl. H03k *1/16, 3/72*
U.S. Cl. 307—295 9 Claims

ABSTRACT OF THE DISCLOSURE

An adaptive filter is described which includes a plurality of capacitor channels containing circuits which permit a sample of the signal to be applied to each capacitor. Frequency translators responsive to the signal and a reference signal develop and apply a plurality of sampling pulses which sequentially operate the sampling circuits. The sampling sequence is adaptive to phase and/or frequency variations in the signal by reason of the frequency translation.

Figure 1:
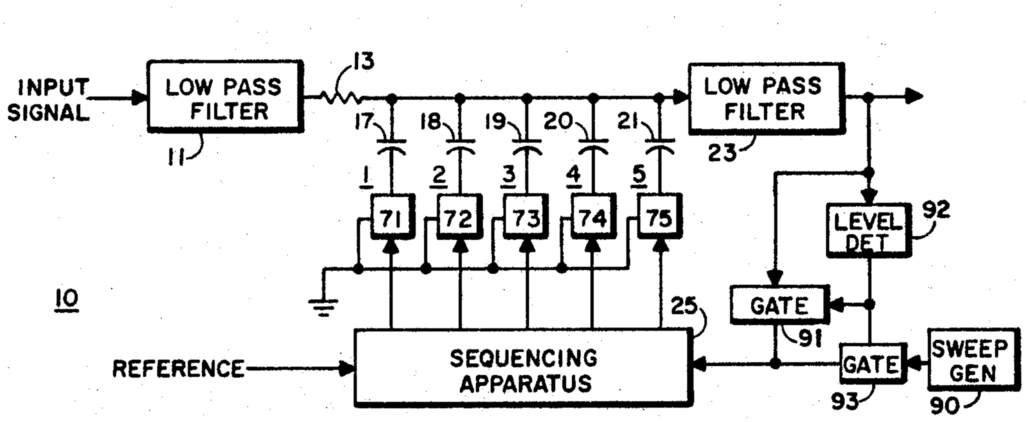

The present invention relates to an apparatus for filtering complex electrical signals having widely varying frequency components, and particularly, to an adaptive electronic filter.

The invention is especially suitable for use in signal tracking apparatus. However, the invention has a wide range of usage in areas of processing and analyzing of information represented by electrical signals.

One arrangement, which has been employed to track a widely varying frequency component of a signal, uses a variable frequency voltage controlled oscillator (VCO) responsive to an error voltage developed by a phase lock loop. The error voltage is developed in the loop by comparing the desired frequency component of the input signal with the output signal generated by the oscillator and deriving the error signal for adjusting the oscillator thereby locking it to the desired frequency component. Although effective, this tracking approach has a disadvantage in that when the desired frequency component rapidly changes in frequency, the VCO will encounter difficulty in trying to exactly match the frequency of the desired component due to the narrow bandwidth of the loop filter. Moreover the phase locked loop is not able to produce an output signal which is precisely in phase with a frequency component that varies widely. Inasmuch as the output signal developed by a VCO has a constant amplitude if information is contained in variations in the amplitude of the input signal, the VCO will not be able to extract this information.

A second type of signal tracking arrangement, which also has been employed, includes a filtering apparatus which consists of a plurality of parallel channels, each channel having a sampling capacitor and a sequencing apparatus adapted to successively switch each capacitor into and out of the path of the input signal at the same frequency as the desired frequency component. With such a system, if the cycling frequency of the sequencing apparatus is exactly equal to the input frequency of the desired component and if the desired frequency component subscribes the same envelope in two or more successive cycles, each capacitor will sample the same portion of the waveform on each successive cycle, and therefore the filter will pass the desired component while substantially blocking other nonharmonically related components. One disadvantage of such a system has been the difficulty of devising a sequencing apparatus, which will perform with a high degree of precision, the required tracking function.

In general, the prior art tracking arrangements have been limited to uses where the frequency component is confined within a narrow frequency band and are generally unsatisfactory where this frequency component may be subject to wide or rapidly varying frequency or phase variations.

It is an object of the invention to provide an improved adaptive filter.

It is another object of the present invention to provide an improved apparatus for tracking a desired frequency component of an input signal which may rapidly vary over wide ranges.

It is still another object of the invention to provide an improved adaptive filter which is adapted to sense changes in a desired frequency component of an input signal and to continuously adjust the frequency response to the filter in order to pass the desired frequency component while excluding the other unwanted components.

A further object of the invention is to provide an improved signal tracking system which substantially overcomes the difficulties and disadvantages above mentioned.

A still further object of the invention is to provide the improved filtering apparatus which is readily adaptable to micro-miniaturization.

A still further object of the present invention is to provide an improved sequencing apparatus which is especially suitable for use in the second type of filtering apparatus described above.

A still further object of the present invention is to provide an apparatus which preserves both the phase and amplitude of the desired (filtered) frequency component while at the same time filtering out the undesirable components.

Briefly described, an adaptive filter in accordance with the invention includes a plurality of successively controlled channels, with each channel including a signal sampling capacitor. Each of these channels also includes a gate which when enabled, permits the applications of the input signal to its associated capacitor. The controlled channels are connected so that when one channel gate is enabled, all the preceding and following gates are inhibited. The frequency of actuation of each gate is equal to the frequency of the desired frequency component (viz the component being tracked), but delayed by a time interval corresponding to a fixed phase angle of the desired frequency component.

The necessary delays are obtained in each of the channels. To this end the filter includes a sequencing apparatus having frequency translating means associated with each channel which process the input signal and a reference signal to derive gate enabling and inhibiting signals. Specifically, the phase angle of the reference signal is delayed by a predetermined phase angle for each channel so that each of the gate actuating signals is at the same frequency as the desired frequency component, but varies from the gate actuating signal for the preceding gate by the predetermined phase angle.

Figure 2:
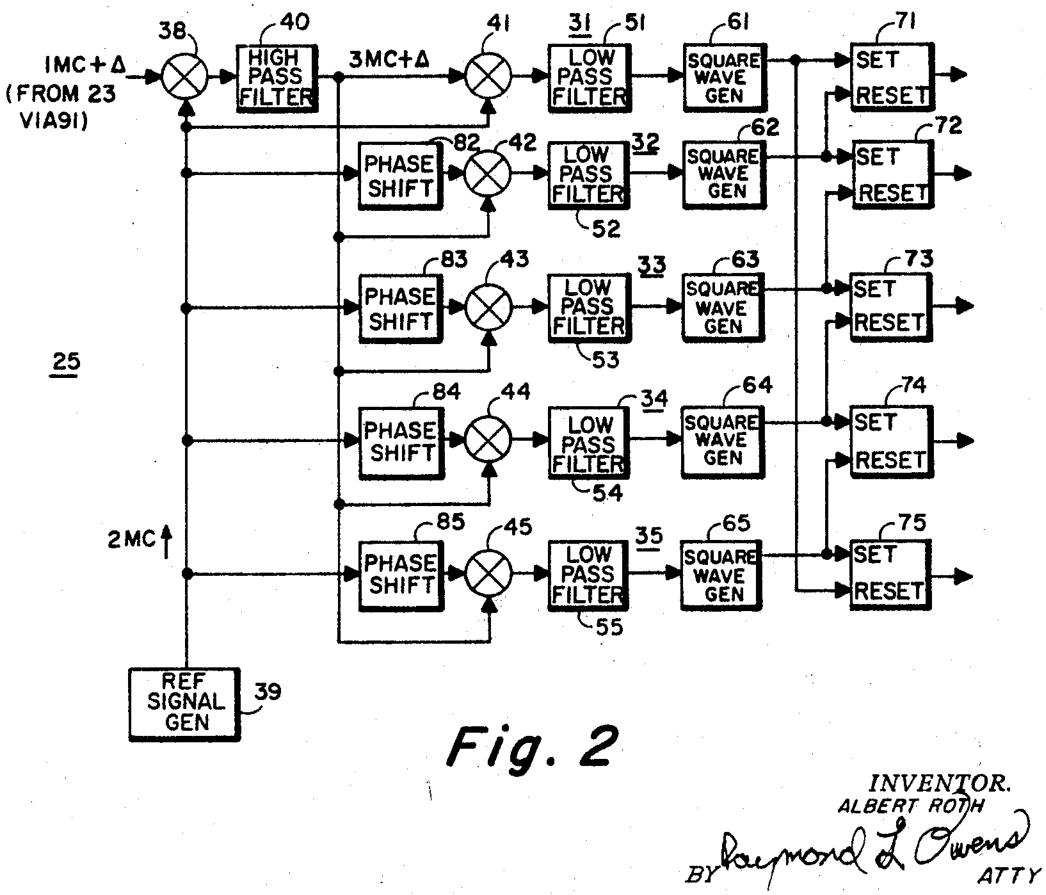

The invention itself both as to its organization and mode of operation, as well as further objects and advantages thereof will become more readily apparent from a reading of the following description taken in conjunction with the accompanying drawing in which:

FIGURE 1 is a diagram partially in block and partially in schematic form of a signal tracking filter in accordance with the present invention; and FIGURE 2 is a block diagram showing in detail the sequencing apparatus of FIGURE 1.

A representative signal tracking filter 10, shown in FIGURE 1, includes a low pass filter 11, eliminating much of the noise and harmonically related frequencies present in the input signal; a resistor 13 in series with five parallel channels 1–5 each including a capacitor (17–21); a low pass filter 23 connected to the channels 1–5; and a sequencing apparatus 25 for controlling gates 71–75 which effectively sample the input signal by connecting the capacitors 17–21 to the resistor 13. Such connections are made at the same frequency as the component of the input signal to be tracked, which for the purpose of illustration has been chosen as the desired component. Each capacitor is inserted and removed from the circuit 10 at the same frequency but delayed in time from the first channel by an interval equal to $$\frac{\phi}{360°}T$$

wherein $$\phi=\frac{(k-1)360°}{n}$$

with $n$ being the number of channels, $k$, being the number assigned to each channel, and T being the period of the desired frequency component. In the illustrated embodiment where there are five channels, each channel will be delayed in phase from the preceding channel by an angle equal to 72°.

The operation of this type of filtering 10 is well known, and accordingly will only be briefly set forth. In operation with the sequencing apparatus 25 exactly tracking the desired input frequency component, and sequentially shifting each of the capacitors 17–21 into and out of the path of the input signal, each capacitor will sample substantially the same portion of the waveform of the desired component on successive cycles. Put another way, each capacitor will, when in the connection with the resistor 13, sample substantially the same portion of the desired component of the input signal on each successive cycle. At the output of the filter 23 the dominant component will be extracted with the random noise components filtered out inasmuch as they will have been averaged out to substantially zero during the sampling process. The sequencing apparatus 25 may also be considered to have five channels 31–35, with each channel being associated with a corresponding channel 1–5 found in the filter 10.

The desired input component from the low pass filter 23 is first applied to a mixer 38. The mixer 38 also receives a reference signal of a very high stablity, from a generator 39, which for illustration purposes, is depicted as being at 2 mc. On the other hand, the desired input component is at a norminal frequency of 1 m. with variations in this frequency being indicated by the symbol Δ. At the output of the mixer 38, a plurality of signals develop; however, only the additive component (3 mc.+Δ) of the two input signals is of interest and is selected by means of a high pass filter 40. The filter 40 applies this signal to a plurality of mixers 41–45, one for each of the channels 31–35.

In the first channel 31, the mixer 41 also receives as an input the reference signal and produces a plurality of outputs. A filter 51 is adapted to extract the difference signal 1 mc.+Δ and apply it to a pulser or square wave generator 61. In turn, the square wave generator 61 produces square waves, the rising voltage edge of each wave actuates the set side of a flip-flop gate 71. Once actuated, the gate 71 completes a circuit from the resistor 13 through the capacitor 17 to ground. This path is established through the collector to emitter of the transistor which is saturated when the flip-flop is set. At this time it should be noted that the remaining channels 32–35 contain many elements corresponding to those in the first channel 31. For instance, the channels 32–35 each respectively contain low pass filters (52–55), generators (62–65), and flip-flop gates (72–75). However, in the second channel 32, before the reference signal enters the mixer 42, it is injected into conventional phase shifting circuitry 82 which delays the phase angle of the reference signal by an amount equal to 72°. Accordingly, the actuating signal generated by the square wave generator 62 in response to the output of the filter 52 will have the same frequency as those developed by the channel 61 but will be delayed by a time interval corresponding to $$\frac{72°}{360°}T$$

wherein T equals the period of the dominant component as described above. In a similar fashion, the delay circuits 83–85 respectively delay the reference signal in the third channel by 144°, in the fourth channel signal by 216°, and in the fifth channel by 288°.

As shown, each of the gates 71–75 receives at its reset side a square wave pulse from its corresponding square wave generator in the following channel. In this connection, it will be noted that the first channel 31 provides a reset signal to the flip-flop 75 in the last channel 35. Accordingly, each time a pulse generator actuates its own flip-flop, it resets the flip-flop in the preceding channel.

An important advantage of the disclosed sequencing apparatus resides in its ability to track a frequency component which fluctuates across a wide range. Thus with the reference at 2 mc. the desired frequency component may theoretically vary from zero to 2 mc.

In order to acquire or initially lock the filter 10 onto the desired frequency, a sweep generator 90 delivers its output directly to the sequencing apparatus 25. When the apparatus 25 sequencing rate reaches the desired input frequency, the filter 23 will generate an output of sufficient amplitude to be detected by the level detector 92 which inhibits gate 93 and enables gate 91. The gate 91 is adapted to apply the output from the filter 23 as an input to the sequencing apparatus 25 as previously discussed. A gate may also be used to permit an output to be passed from the filter to a utilization circuit (not shown).

In operation, the desired input component is compared against a very stable reference signal and provides a signal which is injected into the mixing circuits 41–45, one in each of the channels 31–35. At the same time, each mixer 41–45 receives the same stable reference signal, with the exception that the reference signal in the successive channel is shifted in phase from the preceding channel by the predetermined phase angle. Each channel in response to the output of its mixer generates a signal for actuating its associated gate disposed in the filtering apparatus 10, which in turn switches its associated capacitor in the filter 10 into communication with the input signal while at the same time disabling the gate in the preceding channel.

It must be understood that many modifications in the disclosed embodiment may be made therein within the spirit and scope of the invention. For example, the resistor 13 may be made to be adjustable and thereby providing a means for changing the bandwidth of the filter 10. Furthermore, two or more of filters 10 may be connected in parallel with one filter having a narrow bandwidth and the other having a wide bandwidth. The bandwidth of both may be controlled by a voltage variable resistor such that when the rate of change of frequency is low, the narrow bandwidth filter is in control, and operating at its optimum bandwidth. If the frequency changes at a rapid rate, it is sensed by a comparison between the outputs of the wide and narrow bandwidth filters, and the bandwidth of the narrow band filter widened accordingly by the voltage variable resistor. This technique prevents loss of lock at high slewing rates. If it is desired to track other than the dominant frequency, this can be accomplished by replacing the filters 11 and 23 with band-pass filters whose bandwidths are compatible with the frequency range to be covered. For this mode of operation, however, the parameters of the sequencing apparatus 25 would be changed to be compatible with the desired frequency range.

Accordingly, all such variations and modifications which will occur to these skilled in the art should be included within the spirit and scope of the invention.

What is claimed is:

1. In a filter for extracting a desired frequency component from an input signal having a plurality of unwanted components, said filter having a plurality of signal sampling channels each having gate means for extracting a sample from said signal, the improvement comprising a sequencing apparatus for successively switching each capacitor into and out of said input signal at a frequency which extracts said desired frequency component comprising, (a) a source of reference signal of constant frequency, (b) means responsive to said desired component and said reference signal to develop a first signal, (c) means responsive to said reference and said first signal for sequentially deriving a plurality of sequential actuating signals, and (d) means for applying said actuating signals to different ones of said gate means, whereby said filter is operative to extract said desired component.

2. The invention as set forth in claim 1 wherein said means of subparagraph (c) comprises, (a) a plurality of sequencing channels, each said sequencing channel including phase shifting circuitry for shifting the phase of said reference signal and channel mixing means responsive to said phase shifted reference signal and said first signal for developing said actuating signal at a frequency which is equal to said desired frequency component and in predetermined phase relation to the actuating signals developed by said other apparatus channels.

3. The invention as set forth in claim 2 wherein said first signal frequency is equal to the sum of said reference signal and said desired frequency component.

4. The invention as set forth in claim 3 wherein said sequencing channel includes a filter coupled to said channel mixing means, a pulse generator coupled to said filter and flip-flop means coupled to the output of said pulse generator for providing said gate means.

5. The invention as set forth in claim 4 wherein including an initial channel having additional mixing means responsive to said first signal and said reference signal for developing a gate actuating signal.

6. The invention according to claim 1 wherein said filter includes a resistor coupled to all said channels, and filtering means coupled to the input end of said resistor and across all of said channels.

7. The invention according to claim 6 wherein said second filtering means develops said extracted desired component and applies it as an input to the means of subparagraph (b) in claim 1.

8. A signal tracking filter system for tracking an input signal having a desired frequency component, said system comprising, (a) a plurality of signal sampling means for extracting said desired frequency component, (b) means for operating said signal sampling means in sequence including a separate channel associated with each of said sampling means, said channels each including (i) signal processing means for deriving an actuating signal having a frequency which is a function of a reference signal frequency and the frequency of said desired frequency component, and (ii) a plurality of gate means each corresponding to a different one of said sampling means and operated by said actuating signal at successive increments in the cycle of said actuating signal.

9. The invention as set forth in claim 8 wherein said signal sampling means includes a plurality of separate sampling capacitors and means for applying said input signal to said capacitors via their corresponding gate means.

References Cited

UNITED STATES PATENTS

| | | | |
|---|---|---|---|
| 3,086,172 | 4/1963 | Johnson | 388—133 X |
| 3,329,910 | 7/1967 | Moses | 307—255 X |

DONALD D. FORRER, *Primary Examiner.*

U.S. Cl. X.R.

307—233, 242, 253; 328—15, 138, 167